(12) United States Patent
Chen et al.

(10) Patent No.: US 8,365,400 B2
(45) Date of Patent: Feb. 5, 2013

(54) MANUFACTURING PROCESS FOR A CIRCUIT BOARD

(75) Inventors: Tsung-Yuan Chen, Taoyuan County (TW); Shu-Sheng Chiang, Taipei (TW); David C. H. Cheng, Taoyuang County (TW)

(73) Assignee: Unimicron Technology Corp., Taoyuan (TW)

( * ) Notice: Subject to any disclaimer, the term of this patent is extended or adjusted under 35 U.S.C. 154(b) by 936 days.

(21) Appl. No.: 12/345,386

(22) Filed: Dec. 29, 2008

(65) Prior Publication Data

US 2009/0284935 A1    Nov. 19, 2009

(30) Foreign Application Priority Data

May 13, 2008  (TW) ................. 97117556 A (51) Int. Cl.
*H05K 3/02* (2006.01)
(52) U.S. Cl. ............. 29/846; 29/825; 29/830; 29/832
(58) Field of Classification Search ............ 29/825, 29/830, 832, 840, 846
See application file for complete search history.

(56) References Cited

U.S. PATENT DOCUMENTS

| | | | |
|---|---|---|---|
| 5,504,992 | A | 4/1996 | Fukutomi et al. |
| 7,258,549 | B2 * | 8/2007 | Asahi et al. ............ 439/66 |
| 7,748,110 | B2 * | 7/2010 | Asahi et al. ............ 29/830 |
| 2004/0262029 | A1 | 12/2004 | McConville et al. ...... 174/250 |
| 2005/0184381 | A1 * | 8/2005 | Asahi et al. ............ 257/693 |
| 2007/0158854 | A1 | 7/2007 | Lotz ............ 257/778 |
| 2008/0020132 | A1 | 1/2008 | Huemoeller et al. ........ 427/98.5 |

FOREIGN PATENT DOCUMENTS

| | | |
|---|---|---|
| CN | 2594979 | 12/2003 |
| CN | 1538802 | 10/2004 |
| CN | 1914965 | 2/2007 |
| JP | 06-140742 | 5/1994 |
| JP | 09-036522 | 2/1997 |
| KR | 2008035745 A * | 4/2008 |
| TW | 511239 | 11/2002 |
| TW | 200527994 | 8/2005 |

OTHER PUBLICATIONS

Chinese First Examination Report of China Application No. 200810128855.7, dated Aug. 10, 2010.
"Office Action of Taiwan Counterpart Application", issued on May 10, 2011, p. 1-p. 5.
"Office Action of Japan Counterpart Application", issued on Jun. 28, 2011, p. 1-p. 2.
European Search Report of European Application No. EP 09 25 0862, dated Jul. 3, 2009.
"Second Office Action of China Counterpart Application", issued on Dec. 23, 2011, p. 1-p. 4.

* cited by examiner

*Primary Examiner* — Carl Arbes
(74) *Attorney, Agent, or Firm* — J.C. Patents (57) ABSTRACT

A circuit board structure comprising a composite layer, a fine circuit pattern and a patterned conductive layer is provided. The fine circuit pattern is inlaid in the composite layer, and the patterned conductive layer is disposed on a surface of the composite layer. After fine circuit grooves are formed on the surface of the composite layer, conductive material is filled into the grooves to form the fine circuit pattern inlaid in the composite layer. Since this fine circuit pattern has relatively fine line width and spacing, the circuit board structure has a higher wiring density.

13 Claims, 8 Drawing Sheets

MANUFACTURING PROCESS FOR A CIRCUIT BOARD

CROSS-REFERENCE TO RELATED APPLICATION

This application claims the priority benefit of Taiwan application serial no. 97117556, filed on May 13, 2008. The entirety of the above-mentioned patent application is hereby incorporated by reference herein and made a part of specification.

BACKGROUND OF THE INVENTION

1. Field of the Invention

The present invention relates to a circuit structure and a manufacturing process for a circuit board. More particularly, the present invention relates to a circuit structure and manufacturing process for a circuit board having higher wiring density.

2. Description of Related Art

A conventional circuit board is mainly formed by alternately stacking a plurality of patterned conductive layers and a plurality of dielectric layers, wherein the patterned conductive layers are electrically connected through a plurality of conductive vias. Discriminated based on fabrication processes of the circuit boards, the fabrication processes mainly include a laminating process and a build-up process. Generally, the circuit boards with lower wiring density are mainly fabricated based on the laminating process, and the circuit boards with higher wiring density are mainly fabricated based on the build-up process.

Figure 1A:
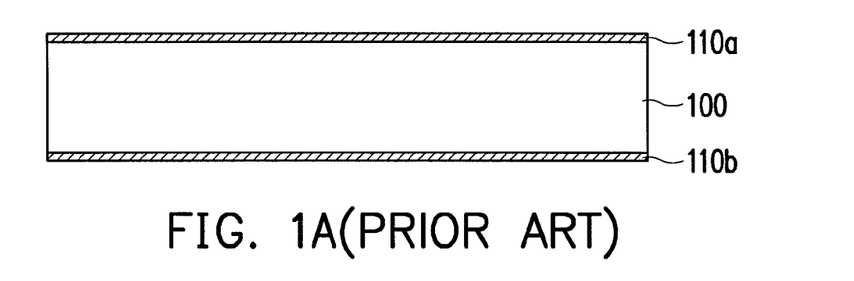
FIGS. 1A-1G are profile flowcharts illustrating a conventional fabrication process for a circuit board.

FIGS. 1A-1G are profile flowcharts illustrating a conventional fabrication process for a circuit board. Referring to FIG. 1A, conductive layers 110a and 110b are respectively disposed on two opposite surfaces of a dielectric layer 100, wherein material of the dielectric layer 100 can be epoxy resin or epoxy resin containing glass fiber, and material of the conductive layers 110a and 110b is copper.

Figure 1B:
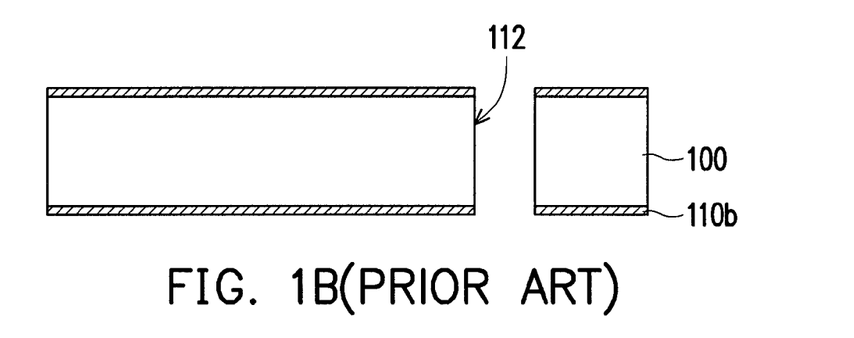

Referring to FIG. 1B, a plurality of through holes 112 (only one is illustrated) is formed in the dielectric layer 100 and the conductive layers 110a and 110b, and the way of forming the through holes 112 can be mechanical drilling or laser ablating.

Figure 1C:
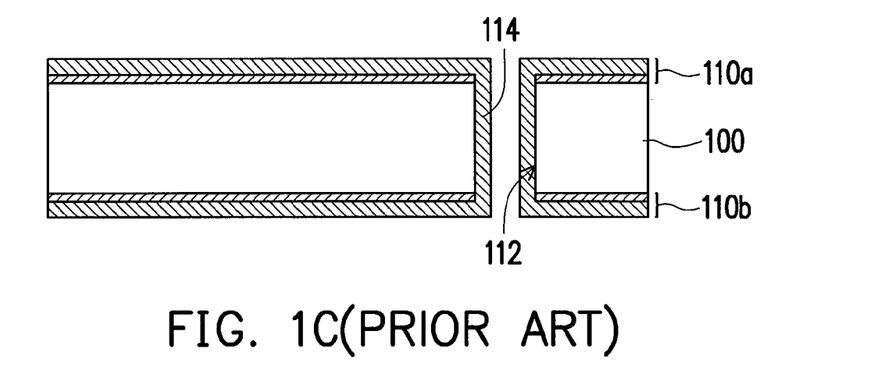

Referring to FIG. 1C, a conductive wall is formed on the surface of the through holes 112 by electroplating, so as to form a conductive through via 114, and meanwhile an electroplating layer is respectively formed on the surfaces of the conductive layers 110a and 110b, and the two electroplating layers are respectively belonged to the conductive layers 110a and 110b.

Figure 1D:
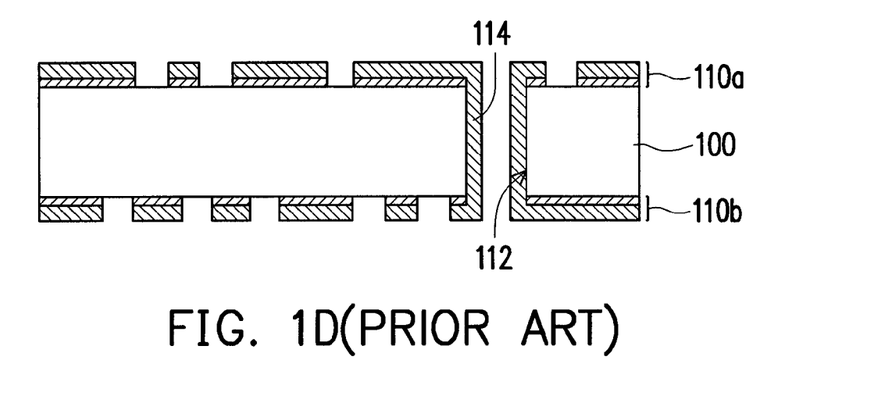

Referring to FIG. 1D, the conductive layers 110a and 110b are patterned by a photolithography and etching process, so as to form the circuit patterns.

Figure 1E:
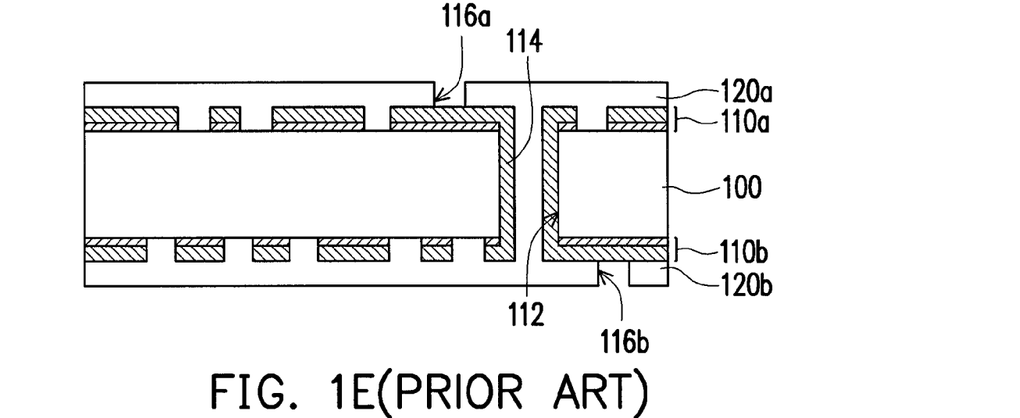

Referring to FIG. 1E, dielectric layers 120a and 120b are respectively formed on the patterned conductive layers 110a and 110b, and openings 116a and 116b are fabricated on the dielectric layers 120a and 120b by mechanical drilling or laser ablating.

Figure 1F:
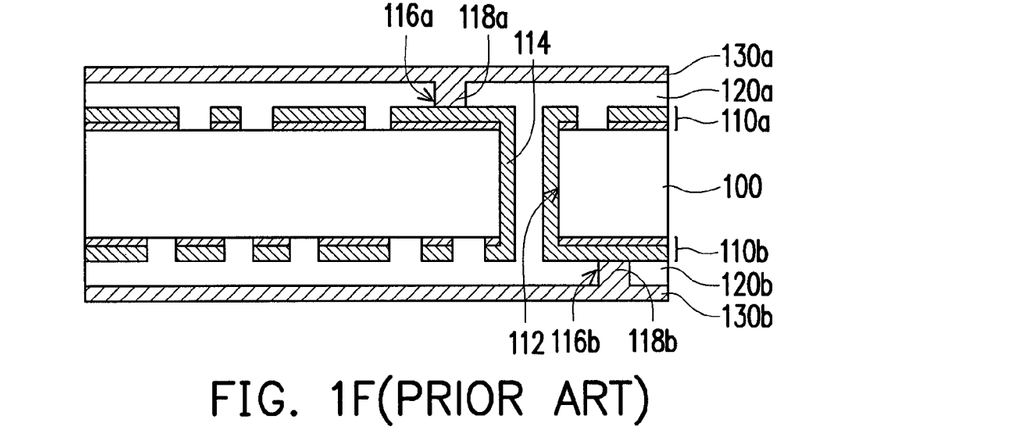

Referring to FIG. 1F, conductive material is filled in the openings 116a and 116b by electroplating, so as to form a plurality of conductive micro via 118a and 118b, and meanwhile conductive layers 130a and 130b are respectively formed on the dielectric layers 120a and 120b, wherein the conductive micro via 118a and 118b, and the un-patterned conductive layers 130a and 130b are formed by electroplating.

Figure 1G:
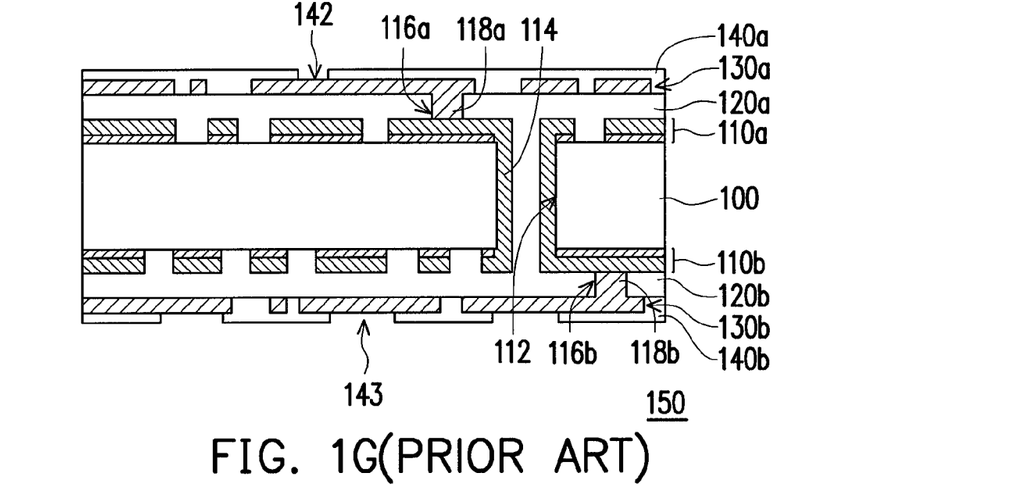

Referring to FIG. 1G, the un-patterned conductive layers 130a and 130b are patterned by the photolithography and etching process. Next, a patterned solder mask 140a is formed on the patterned conductive layer 130a, and a plurality of joint pads 142 of the patterned conductive layer 130a is exposed. Moreover, a patterned solder mask 140b is formed on the patterned conductive layer 130b, and a plurality of joint pads 143 of the patterned conductive layer 130b is exposed. Finally, fabrication of a circuit board structure 150 is finished.

According to the above conventional fabrication process of the circuit board, the circuit board is formed by alternately stacking a plurality of the patterned conductive layers and a plurality of the dielectric layers. However, due to limitation of the conventional fabrication process for the circuit board, i.e. limitation of line width and spacing of a fine circuit, a wiring density of the circuit board fabricated based on the aforementioned method cannot be increased. Moreover, during fabrication of the circuit board, the wiring density of the circuit board is directly related to a possible arranging density of the joint pads provided by the circuit board, wherein function of the joint pads is to lap-joint pins of chips, and function as a medium for signal transmission and power supply. Therefore, with gradually increasing trend for number and density of the pins of an integrated circuit (IC) chip, how to provide a higher wiring density on the circuit board has become one of the major R&D directions in fabrication of the circuit boards.

SUMMARY OF THE INVENTION

Accordingly, the present invention is directed to a circuit board structure and a fabrication process thereof, which may increase a wiring density of a circuit board. The technical knowledge of the present invention is uniquely challenging or difficult for one of ordinary skill in the conventional art.

The present invention provides a circuit board structure including a dielectric layer, a fine circuit pattern and a patterned conductive layer, wherein the fine circuit pattern is inlaid to a surface of the dielectric layer, and the patterned conductive layer is disposed on another surface of the dielectric layer.

The present invention provides a fabrication process for a circuit board. The fabrication process includes following steps. First, a dielectric layer is provided. Next, a fine circuit groove is formed on a surface of the dielectric layer. Next, conductive material is filled in the fine circuit groove to form a fine circuit pattern, and a patterned conductive layer is formed on another surface of the dielectric layer.

The present invention provides a circuit board structure including a composite layer, a fine circuit pattern and a second patterned conductive layer. The composite layer at least includes two dielectric layers and a first patterned conductive layer, wherein the first patterned conductive layer is disposed between the two dielectric layers. Moreover, the fine circuit pattern is inlaid in a surface of the composite layer, and the second patterned conductive layer is disposed on another surface of the composite layer.

The present invention provides a fabrication process for a circuit board. The fabrication process includes following steps. First, a composite layer is provided, wherein the composite layer at least includes two dielectric layers and a first patterned conductive layer, and the first patterned conductive layer is disposed between the two dielectric layers. Next, a fine circuit groove is formed on a surface of the composite layer. Next, conductive material is filled in the fine circuit groove to form a fine circuit pattern, and a second patterned conductive layer is formed on another surface of the composite layer.

In an embodiment of the present invention, while the fine circuit groove is formed, at least one opening is also formed on the dielectric layer where the fine circuit groove is about to be formed, and a portion of the first patterned conductive layer is exposed. While the conductive material is filled in the fine circuit groove, the conductive material is also filled in the openings, so as to form a conductive micro via.

In an embodiment of the present invention, the step of filling the conductive material in the fine circuit groove and the opening includes electroplating.

Accordingly, while the fine circuit pattern is inlaid in the dielectric layer or the composite layer, since a conductive circuit having a fine line width and spacing can be fabricated, wiring density of the circuit board structure can be increased.

In order to make the aforementioned and other objects, features and advantages of the present invention comprehensible, an embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

In the first embodiment of the present invention, fabrication process of a circuit board with double conductive layers is described. FIGS. 2A-2F are profile flowcharts illustrating a fabrication process for a circuit board according to a first embodiment of the present invention.

Figure 2A:
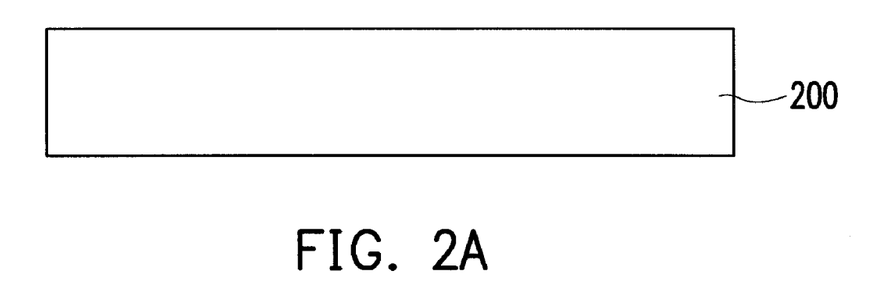
FIGS. 2A-2F are profile flowcharts illustrating a fabrication process for a circuit board according to a first embodiment of the present invention.

Referring to FIG. 2A, a plate utilized in the beginning of the fabrication process can be a dielectric layer 200, and the material thereof can be epoxy resin or epoxy resin containing glass fiber.

Figure 2B:
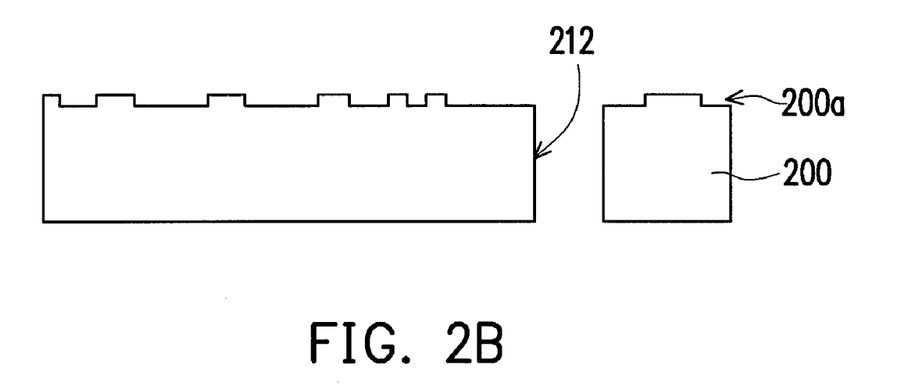

Referring to FIG. 2B, fine circuit grooves 200a are formed on a surface of the dielectric layer 200 by for example, laser ablating, and at least one through hole 212 is formed in the dielectric layer 200 by mechanical drilling or the laser ablating.

Figure 2C:
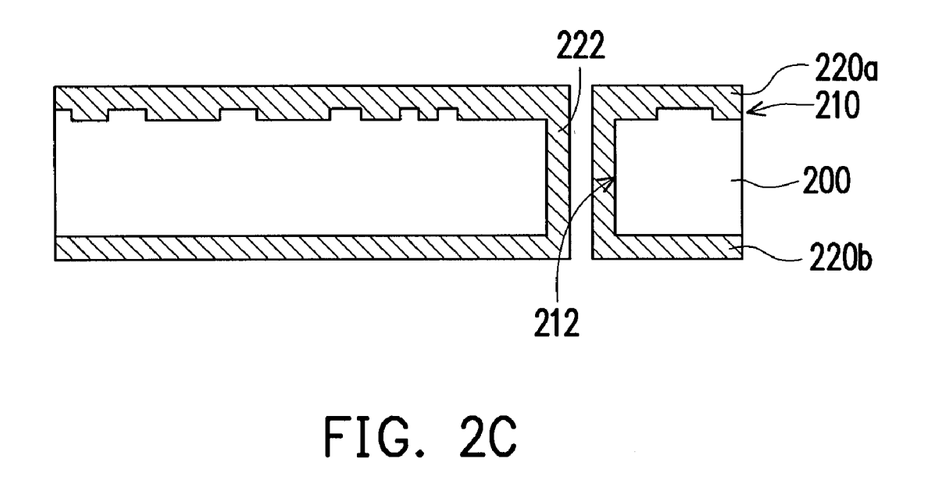

Referring to FIG. 2C, the conductive material (for example, copper) is filled in the fine circuit grooves 200a by for example, electroplating, so as to form a fine circuit pattern 210 inlaid in the surface of the dielectric layer 200. Moreover, while the conductive material is filled by electroplating, a conductive layer 220a, a conductive layer 220b and a conductive via 222 are formed on surfaces of the dielectric layer 200 and the through hole 212. In the present embodiment, the conductive via 222 does not fill up the whole through hole 212, but forms a hollow cylinder.

Figure 2D:
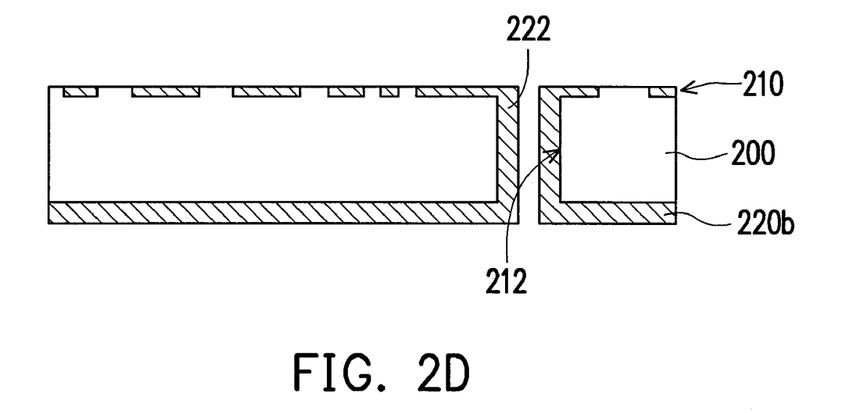

Referring to FIG. 2D, the conductive layer 220a is removed by for example, grinding, and the required fine circuit pattern 210 is remained.

Figure 2E:
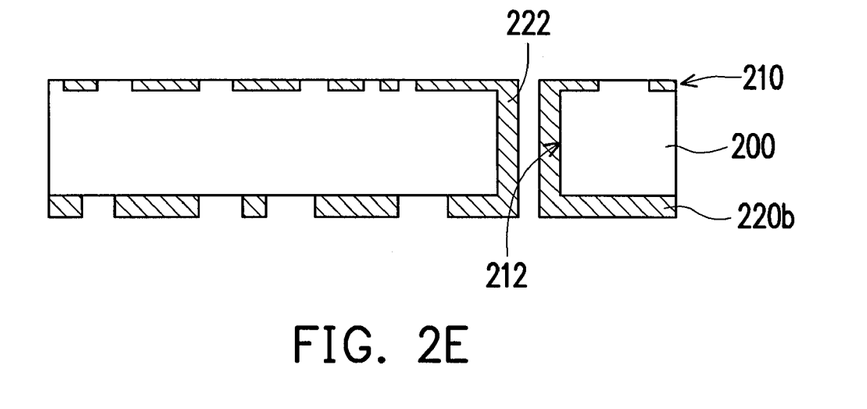

Referring to FIG. 2E, the un-patterned conductive layer 220b is patterned by for example, a photolithography and etching process, so as to form a patterned conductive layer 220b.

Figure 2F:
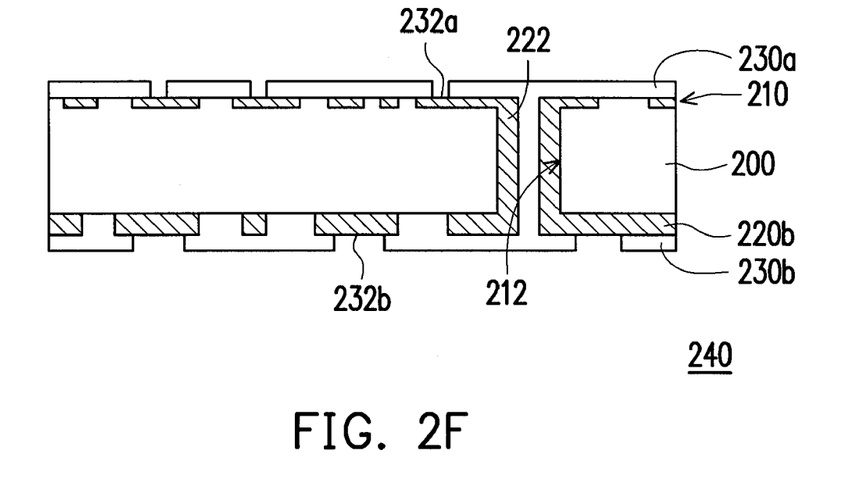

Referring to FIG. 2F, a patterned solder mask 230a is formed on the fine circuit pattern 210, and a plurality of joint pads 232a on the fine circuit pattern 210 is exposed. Moreover, a patterned solder mask 230b is further formed on the patterned conductive layer 220b, and a plurality of joint pads 232b on the patterned conductive layer 220b is exposed. Finally, fabrication of a circuit board structure 240 is finished.

In the first embodiment, formation of the patterned conductive layer 220b is based on a subtractive process, and in other embodiments of the present invention, formation of the patterned conductive layer can also be based on an additive process or a semi-additive process.

Second Embodiment

In the second embodiment of the present invention, fabrication process of a circuit board with double conductive layers is described. FIGS. 3A-3F are profile flowcharts illustrating a fabrication process for a circuit board according to a second embodiment of the present invention.

Figure 3A:
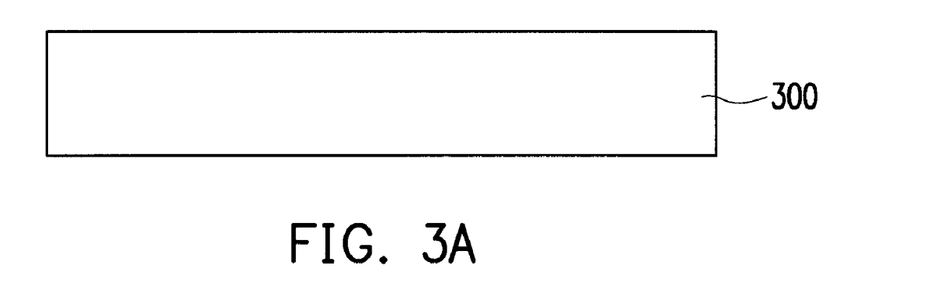
FIGS. 3A-3F are profile flowcharts illustrating a fabrication process for a circuit board according to a second embodiment of the present invention.

Referring to FIG. 3A, a plate utilized in the beginning of the fabrication process can be a dielectric layer 300, and the material thereof can be epoxy resin or epoxy resin containing glass fiber.

Figure 3B:
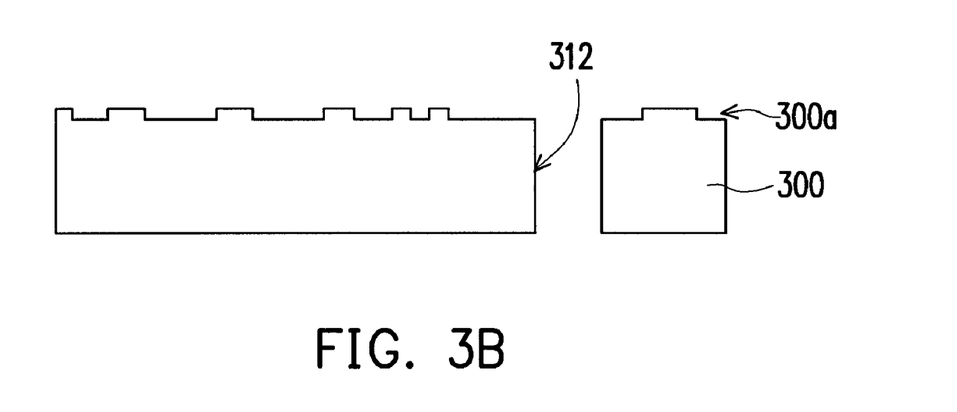

Referring to FIG. 3B, fine circuit grooves 300a are formed on a surface of the dielectric layer 300 by for example, laser ablating, and at least one through hole 312 is formed in the dielectric layer 300 by mechanical drilling or the laser ablating.

Figure 3C:
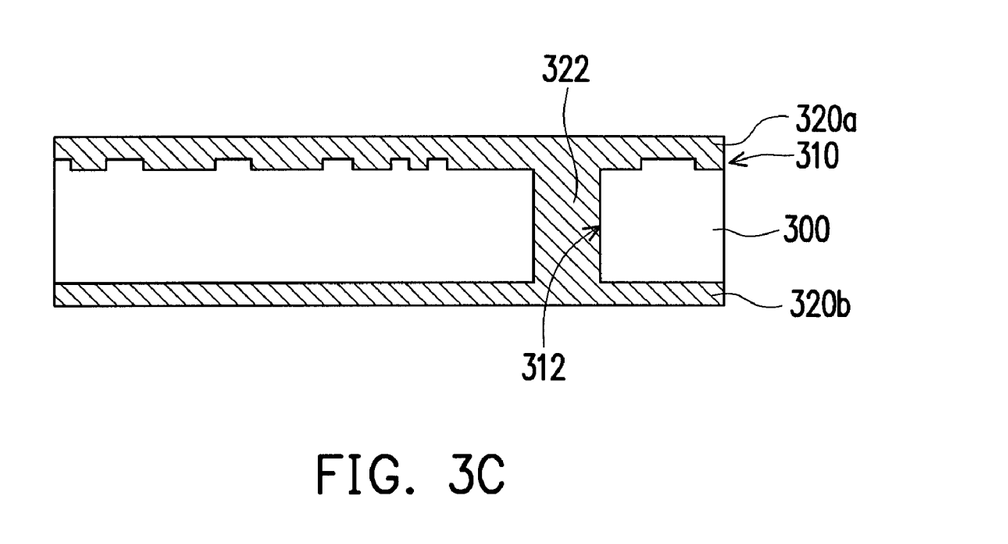

Referring to FIG. 3C, the conductive material (for example, copper) is filled in the fine circuit grooves 300a by for example, electroplating, so as to form a fine circuit pattern 310 inlaid in the surface of the dielectric layer 300. Moreover, while the conductive material is filled by electroplating, a conductive layer 320a, a conductive layer 320b and a conductive via 322 are formed on surfaces of the dielectric layer 300 and the through hole 312. In the present embodiment, the conductive via 322 fills up the whole through hole 312, and forms a solid cylinder.

Figure 3D:
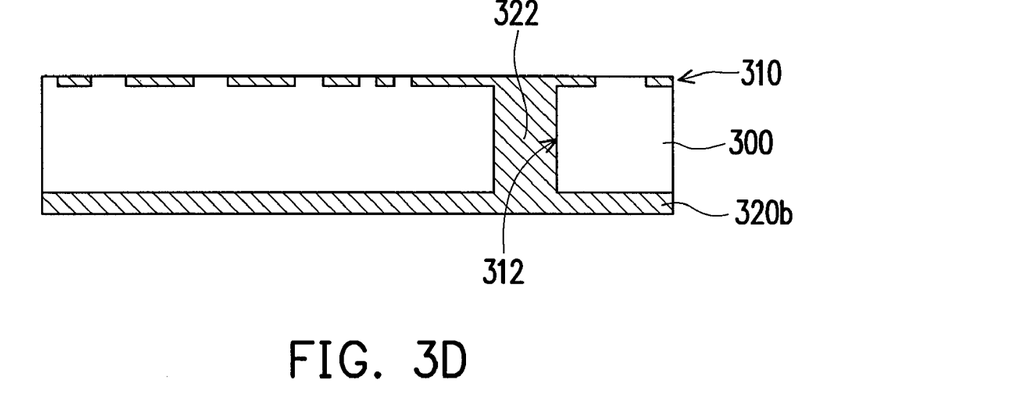

Referring to FIG. 3D, the conductive layer 320a is removed by for example, grinding, and the required fine circuit pattern 310 is remained.

Figure 3E:
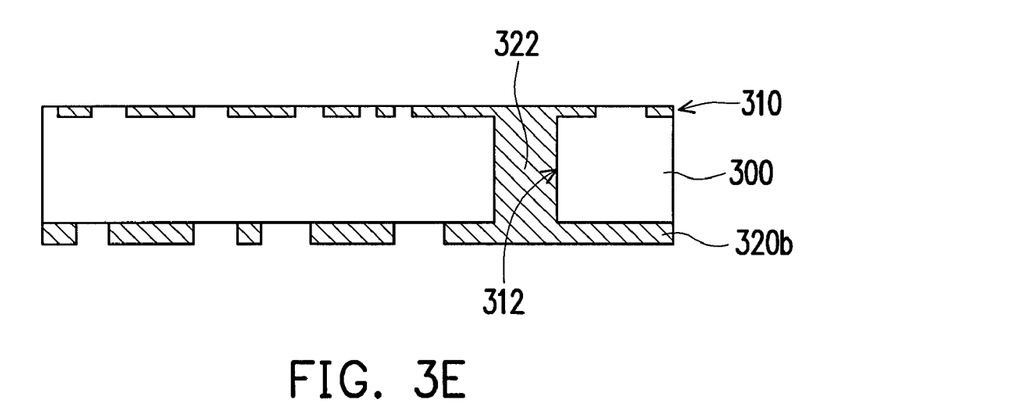

Referring to FIG. 3E, the un-patterned conductive layer 320b is patterned by for example, a photolithography and etching process, so as to form a patterned conductive layer 320b.

Figure 3F:
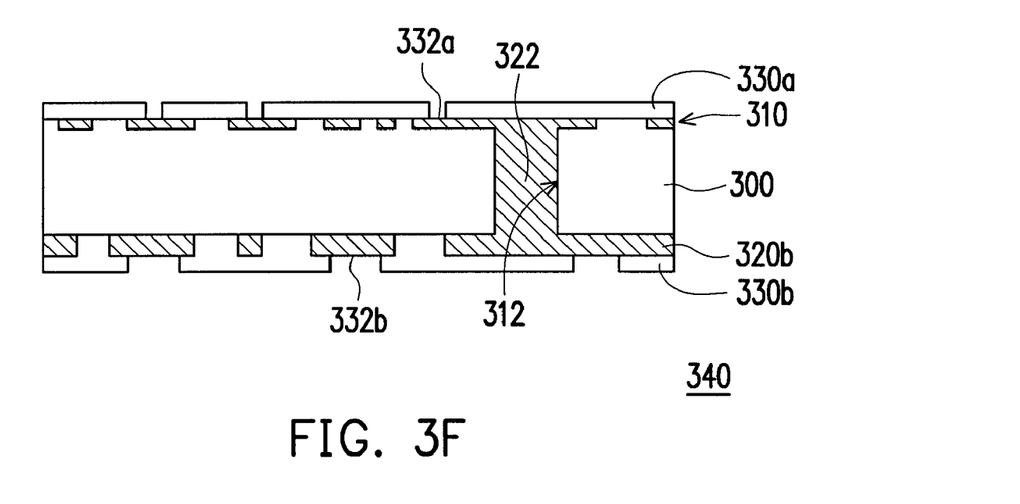

Referring to FIG. 3F, a patterned solder mask 330a is formed on the fine circuit pattern 310, and a plurality of joint pads 332a on the fine circuit pattern 310 is exposed. Moreover, a patterned solder mask 330b is further formed on the patterned conductive layer 320b, and a plurality of joint pads 332b on the patterned conductive layer 320b is exposed. Finally, fabrication of a circuit board structure 340 is finished.

In the second embodiment, formation of the patterned conductive layer 320b is based on the subtractive process, and in other embodiments of the present invention, formation of the patterned conductive layer can also be based on the additive process or the semi-additive process.

Third Embodiment

In the third embodiment of the present invention, fabrication process of a circuit board with multiple conductive layers (in the present embodiment, four conductive layers are applied) is described. FIGS. 4A-4F are profile flowcharts illustrating a fabrication process for a circuit board according to a third embodiment of the present invention.

Figure 4A:
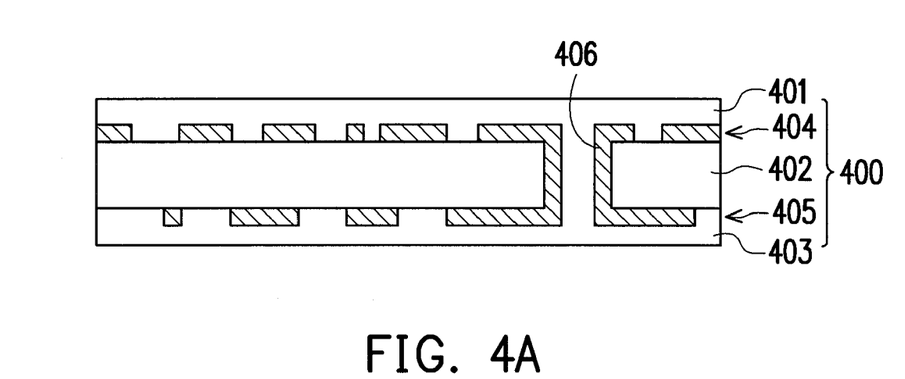
FIGS. 4A-4F are profile flowcharts illustrating a fabrication process for a circuit board according to a third embodiment of the present invention.

Referring to FIG. 4A, a plate utilized in the beginning of the fabrication process can be a composite layer 400 including three dielectric layers 401, 402 and 403, two patterned conductive layers 404 and 405, and at least one conductive via 406. Material of the dielectric layers 401, 402 and 403 can be epoxy resin or epoxy resin containing glass fiber, etc., and material of the patterned conductive layers 404 and 405 can be coppers, etc. The conductive via 406 electrically connects the patterned conductive layers 404 and 405, and has a shape of a hollow cylinder shown in FIG. 4A or a solid cylinder which is not shown. Since fabrication method of the composite layer 400 is similar to that in the conventional technique, and therefore detailed description thereof will not be repeated.

Figure 4B:
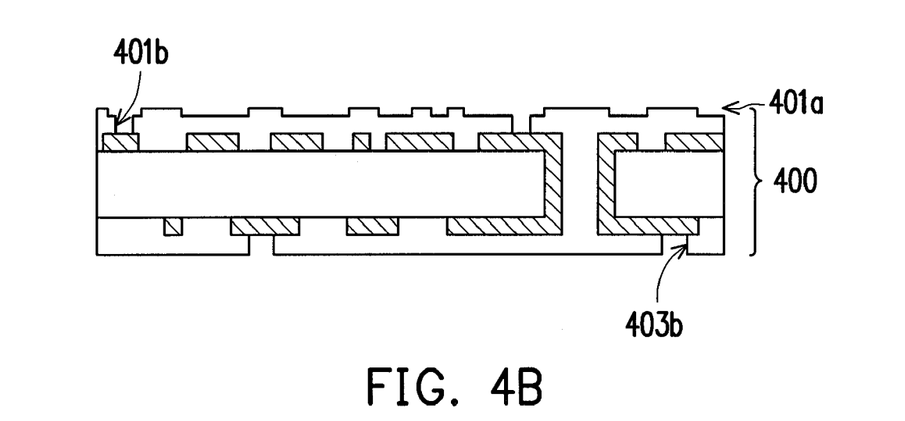

Referring to FIG. 4B, fine circuit grooves 401a are formed on a surface of the composite layer 400 by the laser ablating, at least one opening 401b is formed in the dielectric layer 401, and at least one opening 403b is formed in the dielectric layer 403 by mechanical drilling or the laser ablating.

Figure 4C:
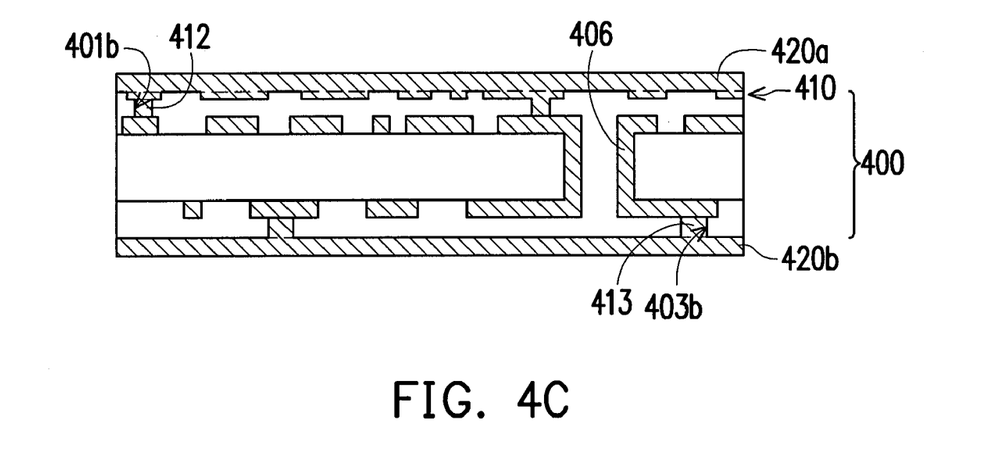

Referring to FIG. 4C, the conductive material (for example, copper) is filled in the fine circuit grooves 401a by for example, electroplating, so as to form a fine circuit pattern 410 inlaid in the surface of the composite layer 400. Moreover, while the conductive material is filled by electroplating, a conductive layer 420a, a conductive layer 420b, a conductive micro via 412 and a conductive micro via 413 are formed on the surface of the composite layer 400.

Figure 4D:
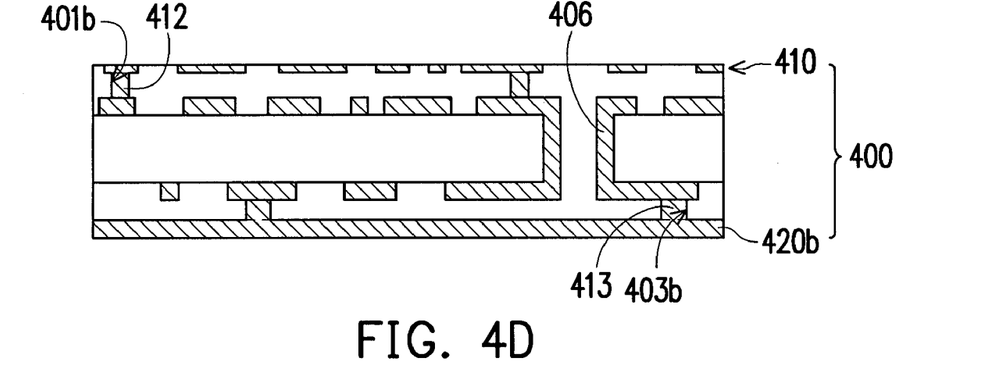

Referring to FIG. 4D, the conductive layer 420a is removed via for example, grinding, and the required fine circuit pattern 410 is remained.

Figure 4E:
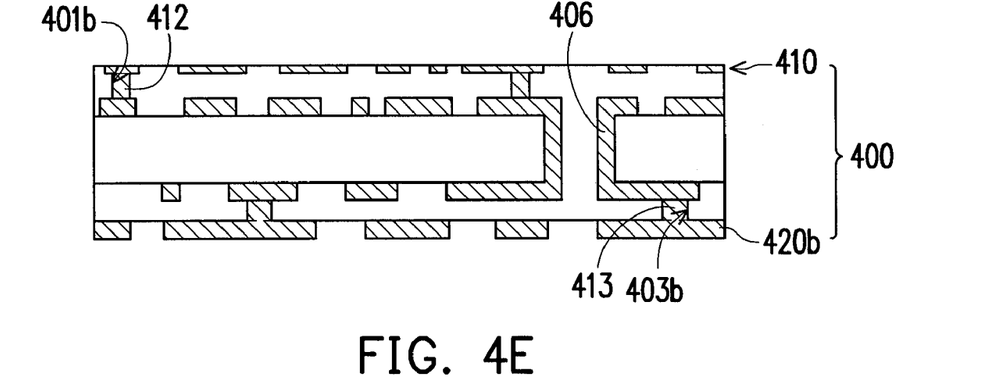

Referring to FIG. 4E, the un-patterned conductive layer 420b is patterned by for example, a photolithography and etching process, so as to form a patterned conductive layer 420b.

Figure 4F:
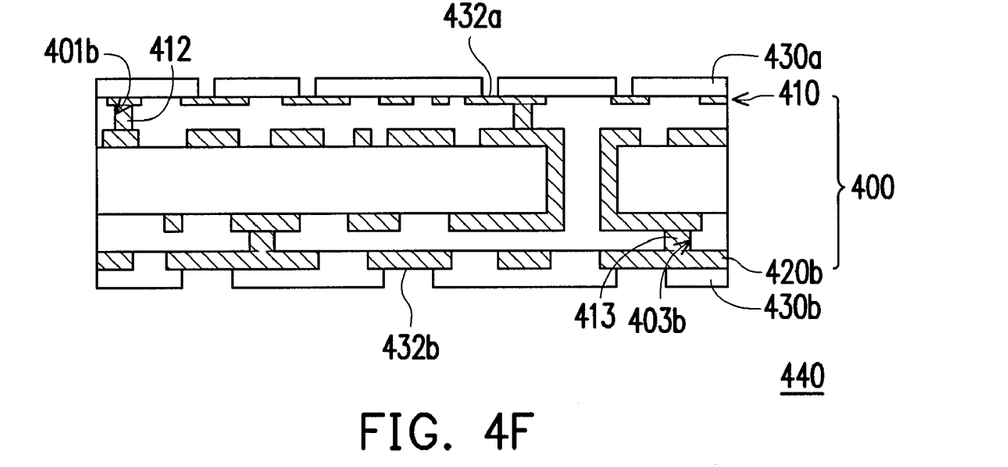

Referring to FIG. 4F, a patterned solder mask 430a is formed on the fine circuit pattern 410, and a plurality of joint pads 432a on the fine circuit pattern 410 is exposed. Moreover, a patterned solder mask 430b is further formed on the patterned conductive layer 420b, and a plurality of joint pads 4332b on the patterned conductive layer 420b is exposed. Finally, fabrication of a circuit board structure 440 is completed.

In the third embodiment, formation of the patterned conductive layer 420b is based on the subtractive process, and in other embodiments of the present invention, formation of the patterned conductive layer can also be based on the additive process, wherein the additive process includes a full additive process and a semi-additive process.

In summary, according to the present invention, the fine circuit grooves are pre-formed on the surface of the dielectric layer (or the composite layer) by for example, the laser ablating, and then the conductive material is filled in the fine circuit grooves to form the fine circuit pattern. Next, the fine circuit pattern is taken as a patterned conductive layer of the circuit board and is electrically connected to other patterned conductive layers by the through holes or micro via. Therefore, the fabrication method of the present invention can be applied to the circuit board having two or more conductive layers.

Moreover, according to the present invention, the fine circuit pattern is formed on one side of the circuit board for providing a higher wiring density, and a general patterned conductive layer is formed on the other side of the circuit board for providing a general wiring density. Therefore, when the circuit board functions as a carrier (carrier board) for IC chips, the IC chips is disposed on only one side of the circuit board, and the fine circuit pattern can be formed on the same side for providing the higher wiring density, and the general conductive layer can be formed on other side of the circuit board for providing the general wiring density.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication process for a circuit board, comprising:
   providing a core layer with surface material thereof being dielectric material, having a first surface and a corresponding second surface;
   forming a fine circuit groove on the first surface of the core layer;
   filling conductive material in the entire of the fine circuit groove to form a fine circuit pattern, wherein the fine circuit pattern is embedded in the first surface of the core layer; and
   forming a patterned conductive layer on the second surface of the core layer, wherein the patterned conductive layer protrudes from the second surface of the core layer.

2. The fabrication process for a circuit board as claimed in claim 1, wherein the step of forming the fine circuit groove comprises laser ablating.

3. The fabrication process for a circuit board as claimed in claim 1, wherein the step of filling the conductive layer in the fine circuit groove comprises electroplating.

4. The fabrication process for a circuit board as claimed in claim 1, further comprising:
   forming a first solder mask on the first surface of the dielectric layer, wherein the fine circuit pattern has at least a first joint pad, and after the first solder mask is formed, the first joint pad is exposed.

5. The fabrication process for a circuit board as claimed in claim 4, further comprising:
   forming a second solder mask on the second surface of the dielectric layer, wherein the second patterned conductive layer has at least a second joint pad, and after the second solder mask is formed, the second joint pad is exposed.

6. The fabrication process for a circuit board as claimed in claim 1, wherein the core layer is a composite layer comprising a plurality of dielectric layers and at least a first patterned conductive layer, the first patterned conductive layer is disposed between the dielectric layers, and two of the dielectric layers respectively form the first surface and the second surface of the core layer.

7. The fabrication process for a circuit board as claimed in claim 6, wherein the composite layer further comprises a plurality of the first patterned conductive layers and at least a conductive through via penetrating at least one of the dielectric layers and connecting at least two of the first patterned conductive layers, and the conductive through via has a shape of hollow cylinder or solid cylinder.

8. The fabrication process for a circuit board as claimed in claim 6 further comprising forming at least one opening on the dielectric layer where the fine circuit groove is to be formed to expose a portion of the first patterned conductive layer while the fine circuit groove is formed; and filling the conductive material in the opening to form a conductive micro via while the conductive material is filled in the fine circuit groove, wherein while the conductive material is filled in the fine circuit groove and the opening by electroplating, a conductive layer is formed on the second surface of the composite layer, and the conductive layer is patterned to form the second patterned conductive layer.

9. The fabrication process for a circuit board as claimed in claim 8, wherein the step of filling the conductive material in the fine circuit groove and the opening comprises electroplating.

10. The fabrication process for a circuit board as claimed in claim 8, wherein the step of patterning the conductive layer comprises a subtractive process or photolithography and etching.

11. The fabrication process for a circuit board as claimed in claim 6, wherein the step of forming the second patterned conductive layer comprises an additive process or a semi-additive process.

12. The fabrication process for a circuit board as claimed in claim 6, wherein the step of forming the second patterned conductive layer comprises:

forming a conductive layer on the second surface of the composite layer; and patterning the conductive layer to form the patterned conductive layer.

13. The fabrication process for a circuit board as claimed in claim 12, wherein the step of patterning the conductive layer comprises photolithography and electroplating.

\* \* \* \* \*